US008981463B2

(12) United States Patent
Sandhu

(10) Patent No.: US 8,981,463 B2
(45) Date of Patent: Mar. 17, 2015

(54) MEMORY CELL ARRAY WITH SEMICONDUCTOR SELECTION DEVICE FOR MULTIPLE MEMORY CELLS

(71) Applicant: Micron Technology, Inc., Boise, ID (US)

(72) Inventor: Gurtej Sandhu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 14/105,271

(22) Filed: Dec. 13, 2013

(65) Prior Publication Data

US 2014/0097503 A1    Apr. 10, 2014

Related U.S. Application Data

(62) Division of application No. 13/835,552, filed on Mar. 15, 2013, now Pat. No. 8,648,428, which is a division of application No. 12/652,524, filed on Jan. 5, 2010, now Pat. No. 8,421,164.

(51) Int. Cl.
| | |
|---|---|
| H01L 29/66 | (2006.01) |
| H01L 27/06 | (2006.01) |
| H01L 27/102 | (2006.01) |
| H01L 27/24 | (2006.01) |
| H01L 29/88 | (2006.01) |
| H01L 27/088 | (2006.01) |

(52) U.S. Cl.
CPC ........ *H01L 27/0629* (2013.01); *H01L 27/1021* (2013.01); *H01L 27/24* (2013.01); *H01L 29/88* (2013.01); *H01L 27/088* (2013.01)
USPC ............ 257/329; 257/401; 365/148; 365/163

(58) Field of Classification Search
USPC ......... 257/190, 288, 296, 329, 384, 413, 618, 257/656, 734; 365/148, 154, 163; 438/38, 438/268
See application file for complete search history.

(56) References Cited

U.S. PATENT DOCUMENTS

| | | |
|---|---|---|
| 5,107,321 A | 4/1992 | Ilderem et al. |
| 5,824,577 A | 10/1998 | Luich |
| 5,899,735 A | 5/1999 | Tseng |
| 6,165,826 A | 12/2000 | Chau et al. |
| 6,218,276 B1 | 4/2001 | Liu et al. |
| 6,300,198 B1 | 10/2001 | Aeugle et al. |
| 6,301,147 B1 | 10/2001 | El-Sharawy et al. |
| 6,940,113 B2 | 9/2005 | Hsu et al. |
| 7,247,876 B2 | 7/2007 | Lowrey |
| 7,391,664 B2 | 6/2008 | Parkinson et al. |
| 2004/0157353 A1 | 8/2004 | Ouyang et al. |
| 2006/0017088 A1 | 1/2006 | Abbott et al. |
| 2008/0035958 A1 | 2/2008 | Asao |
| 2008/0049486 A1 | 2/2008 | Gruening-von Schwerin |
| 2008/0099814 A1 | 5/2008 | Gruening-von Schwerin et al. |
| 2008/0224178 A1 | 9/2008 | Pacha et al. |
| 2008/0258129 A1* | 10/2008 | Toda ............................. 257/5 |
| 2008/0273369 A1 | 11/2008 | Angerbauer et al. |
| 2008/0277642 A1 | 11/2008 | In T Zandt et al. |
| 2009/0154227 A1 | 6/2009 | Philipp et al. |
| 2010/0148324 A1 | 6/2010 | Chen et al. |
| 2010/0188891 A1* | 7/2010 | Taniguchi et al. ............ 365/158 |

* cited by examiner

*Primary Examiner* — Errol Fernandes
(74) *Attorney, Agent, or Firm* — Dickstein Shapiro LLP

(57) ABSTRACT

A memory array that includes access devices that are each electrically coupled to more than one memory cell. The memory cells are coupled to the access devices via diode devices. The access devices include vertical semiconductor material mesas upstanding from a semiconductor base that form a conductive channel between first and second doped regions, and also planar access devices.

6 Claims, 9 Drawing Sheets

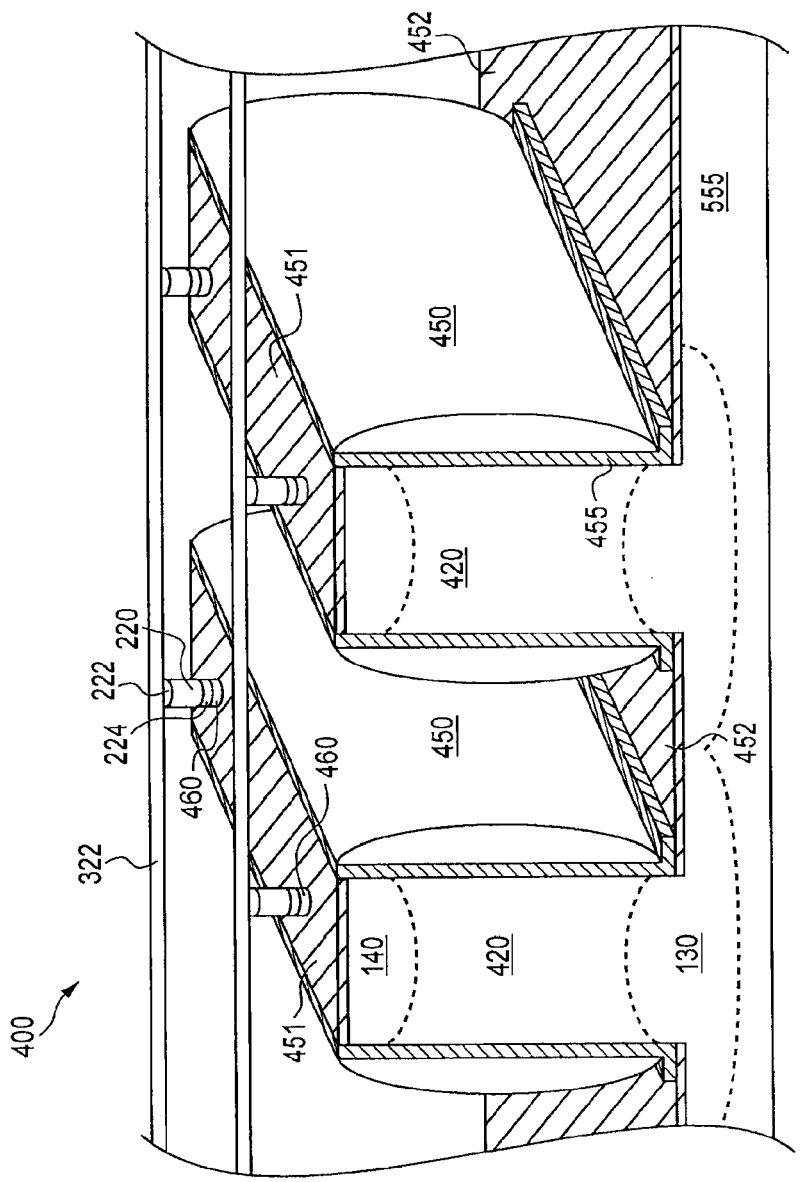

MEMORY CELL ARRAY WITH SEMICONDUCTOR SELECTION DEVICE FOR MULTIPLE MEMORY CELLS

CROSS-REFERENCE TO RELATED APPLICATIONS

This application is a divisional of U.S. patent application Ser. No. 13/835,552, filed Mar. 15, 2013, which is a divisional of U.S. patent application Ser. No. 12/652,524 (now U.S. Pat. No. 8,421,164), filed Jan. 5, 2010, the specifications of which are herein incorporated by reference in their entirety. This application is also related to U.S. patent application Ser. Nos. 12/469,433 and 12/469,563, both filed on May 20, 2009, the specifications of which are herein incorporated by reference in their entirety.

FIELD OF THE INVENTION

The embodiments disclosed herein relate generally to the field of semiconductor selection devices and, more particularly, to access devices for semiconductor memory devices.

BACKGROUND OF THE INVENTION

A non-volatile memory device is capable of retaining stored information even when power to the memory device is turned off Traditionally, non-volatile memory devices occupied large amounts of space and consumed large quantities of power. As a result, non-volatile memory devices have been widely used in systems where limited power drain is tolerable and battery-life is not an issue. However, as systems requiring non-volatile memories have continued to shrink in size, improvements in non-volatile memory devices have been sought in order to make these devices more suitable for use in portable electronics or as substitutes for frequently-accessed volatile memory devices. Desired improvements include decreasing the size and power consumption of these memories and improving the memory access devices.

Improved non-volatile memory devices under research include resistive memory cells where resistance states can be programmably changed. Resistive memory cells store data by structurally or chemically changing a physical property of the memory cells in response to applied programming voltages, which in turn changes cell resistance. Examples of variable resistance memory devices being investigated include memories using variable resistance polymers, perovskite materials, doped amorphous silicon, phase-changing glasses, and doped chalcogenide glass, among others. Phase change memory ("PCM") cells have varying resistances as a result of changes in the crystal phase of the cell material. Spin-tunneling random access memory ("STRAM") cells have varying resistances as a result of changes in current induced magnetization of the cell material.

For many resistive memory cells, changing the cell resistance is accomplished by passing an electrical current of sufficient strength through the resistive memory cell. For phase change memory cells and spin-tunneling memory cells, for example, programming and reset currents of 50 to 100 µA are not uncommon. However, these high currents result in extremely high current densities as the size of the memory cells continues to shrink. For example, for a 20×20 nm$^2$ memory cell, the resulting current density is of the order of $1\times10^7$ A/cm$^2$ or greater. For such high current densities, improved memory access devices are desired to provide high currents and low "off" state leakage.

Improved access devices such as those desired for use with resistive memory cells could also be used to provide high currents to any type of memory or semiconductor circuit that requires a high current.

BRIEF DESCRIPTION OF THE DRAWINGS

FIGS. 3A and 3B illustrate an array of memory cells and memory access devices, according to one or more embodiments of the disclosure.

DETAILED DESCRIPTION OF THE INVENTION

Traditional memory access devices are planar in nature, meaning that the access devices are formed layer by layer within the plane of the underlying structure. The underlying structure includes a substrate that is a base material and layers formed on the surface of the substrate. The substrate and overlaying layers on top of the substrate are flat or planar. The access devices are formed within these layers so that the resulting devices are also laid out in a planar arrangement. As a specific example, a planar field-effect transistor ("FET") is a FET with a conductive channel that is within the layers of the underlying structure. Planar access devices have a relatively large footprint since area is required for source and drain contacts as well as isolation between the contacts.

Non-planar access devices are alternatives to planar devices. Non-planar access devices are access devices that are not flat or planar and can be oriented in a vertical direction from a substrate. These devices can include raised portions that extend above the planar surface of the underlying structure. An example of a non-planar access device is a fin-FET. A fin-FET is a FET that includes thin vertical "fins" of the underlying substrate material that act as the transistor body. The source and drain of the fin-FET are located at the ends of the fin, while one or more gates are located on a surface of the fin. Upon activation, current flows through the fin. The thin vertical structure results in significant space savings over traditional planar access devices.

Figure 1:
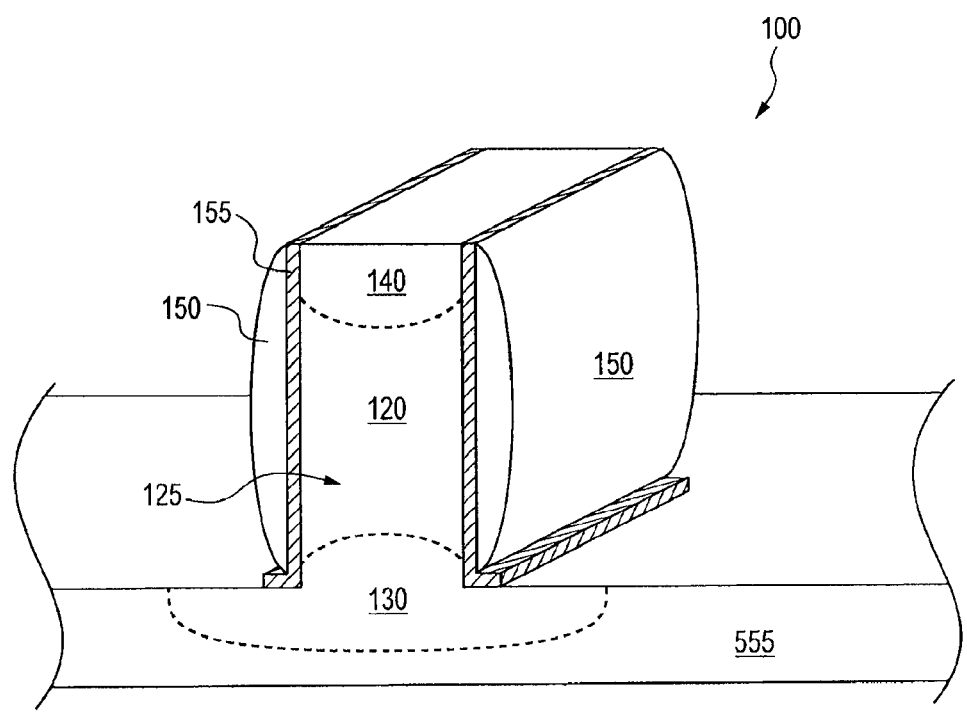
FIG. 1 illustrates a vertically-oriented semiconductor transistor device.

FIG. 1 illustrates a vertical FET 100. The vertical FET 100 includes a thin vertical fin or mesa 120 through which current flows vertically between a source 130 and a drain 140. The mesa 120 extends above a substrate 555. In the example vertical FET 100, the substrate 555 and the mesa 120 are formed of silicon. The source 130 and drain 140 regions are both either n-doped or p-doped, while a vertical current channel 125 is either p-doped or n-doped, accordingly. A gate 150 is formed along a sidewall of the mesa 120. Additional gates 150 may be formed. In the example of FIG. 1, two gates 150 are formed on opposite sidewalls of the mesa 120, although vertical FET 100 may also be formed with only a single gate 150. Gates 150 are separated from the sidewalls of the mesa 120 by thin gate insulators 155 such as a gate oxide layer. The thin gate insulators 155 are L-shaped in order to insulate the gates 150 from contact with the mesas 120 and the substrate 555 or any conductor on the substrate 555. The gates 150 may be formed of polysilicon. When an appropriate bias is applied to one or more of the gates 150, current flows vertically through the channel 125 from the source 130 to the drain 140.

Figure 2A:
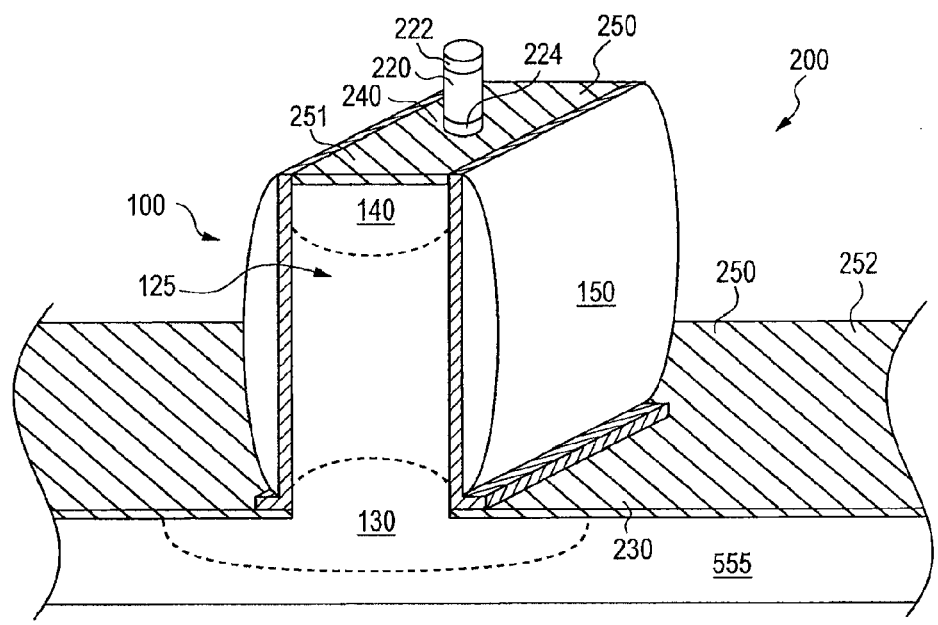
FIGS. 2A and 2B illustrate a memory cell and a memory access device, according to one or more embodiments of the disclosure.
Figure 2B:
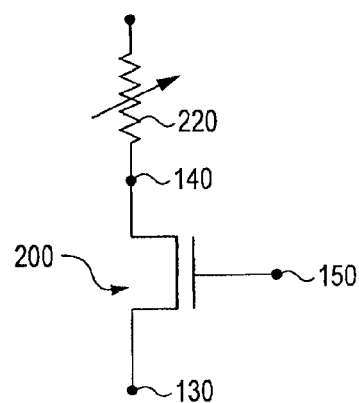

In a disclosed embodiment, the vertical FET 100 may be used as a selection device such as a memory access device 200 for one or more electrical devices, as illustrated in the structure of FIG. 2A and the schematic diagram of FIG. 2B. In FIG. 2A, a memory cell 220 is electrically coupled to the vertical FET device 200. The memory cell 220 includes a top electrode 222 and a bottom electrode 224. The bottom electrode 224 is coupled to a contact 240 for the drain 140. The source 130 is coupled to a contact 230. Upon appropriate biasing of the source contact 230, the gate 150 and the top electrode 222, the vertical FET 100 is turned "on" and current flows through the channel 125 and memory cell 220. With appropriate biasing, the current flowing through the memory cell 220 is strong enough to be used as a programming or reset current for the memory cell 220.

The memory access device 200 and the memory cells 220 are generally formed in an array of access devices 200 and memory cells 220. Thus, the source contact 230 may extend a distance from the source 130 of memory access device 200 to the nearest voltage source. Additionally, source contacts 230 may be shared by multiple access devices. In order to facilitate the shared contacts 230 and to minimize the effect of parasitic resistance, the contacts 230 are formed of metal silicide 250. In other words, the substrate 555 surface near the bottom of the mesa 120 is silicided with metal such as Ni, Co or Ti. The metal silicide 250 (also known as a salicide) near the bottom of the mesa 120 (or the source metal silicide 252) acts to reduce the series resistance that results from using a common current source contact for each individual access device 200 in an array.

Additionally, the drain contact 240 is also formed of a metal silicide 250 which helps to reduce contact resistance between the access device 200 and the bottom electrode 224 of the memory cell 220. The metal silicide 250 formed on the upper portion of the access device 200 is the drain metal silicide 251.

In an embodiment, the access devices 200 and the memory cells 220 are arranged in an array 400 as illustrated in FIG. 3A. In FIG. 3A, a memory cell array 400 is illustrated that includes columns of silicon vertical FET mesas 420. Each column includes a single mesa 420 that extends the length of the column. The base portion of each mesa 420 is doped as a source and is electrically coupled to one or more strips of source metal silicide 452 located on the silicon substrate 555. The source metal silicide 452 covers the exposed portions of the silicon substrate 555. The upper portion of each mesa 420 is doped as a drain and is electrically coupled to a drain metal silicide 451 that covers the top of each respective mesa 420. One or more sidewalls of each mesa 420 are lined by a thin gate insulator 455 and a gate 450. In the example of FIG. 3A, gates 450 are formed on two opposite sides of each mesa 420, thus forming double-gated vertical FETs. Single-gated and surround-gated vertical FETs may also be formed. In the present embodiment, sidewall gates 450 extend along each mesa 420 so that each mesa column includes one or two common sidewall gates 450. Memory cells 220 are coupled to the drains of each mesa 420 via bottom electrodes 224 and the drain metal silicide 451 located on the tops of each mesa 420. Memory cells 220 are coupled to conductors 322 via top electrodes 222. In one embodiment, conductors 322 may extend horizontally in a direction perpendicular to the direction that the sidewall gates 450 extend. Other array layouts are contemplated where conductors 322 may extend in a direction other than perpendicular to sidewall gates 450.

Other substrate and mesa materials, such as Ge, SiC, GaN, GaAs, InP, carbon nanotube and grephene, for example, may be used instead of silicon. Additionally, the array 400 generally includes many more than just two mesas. The illustration of the array 400 is simplified in order to aid explanation.

Figure 3B:
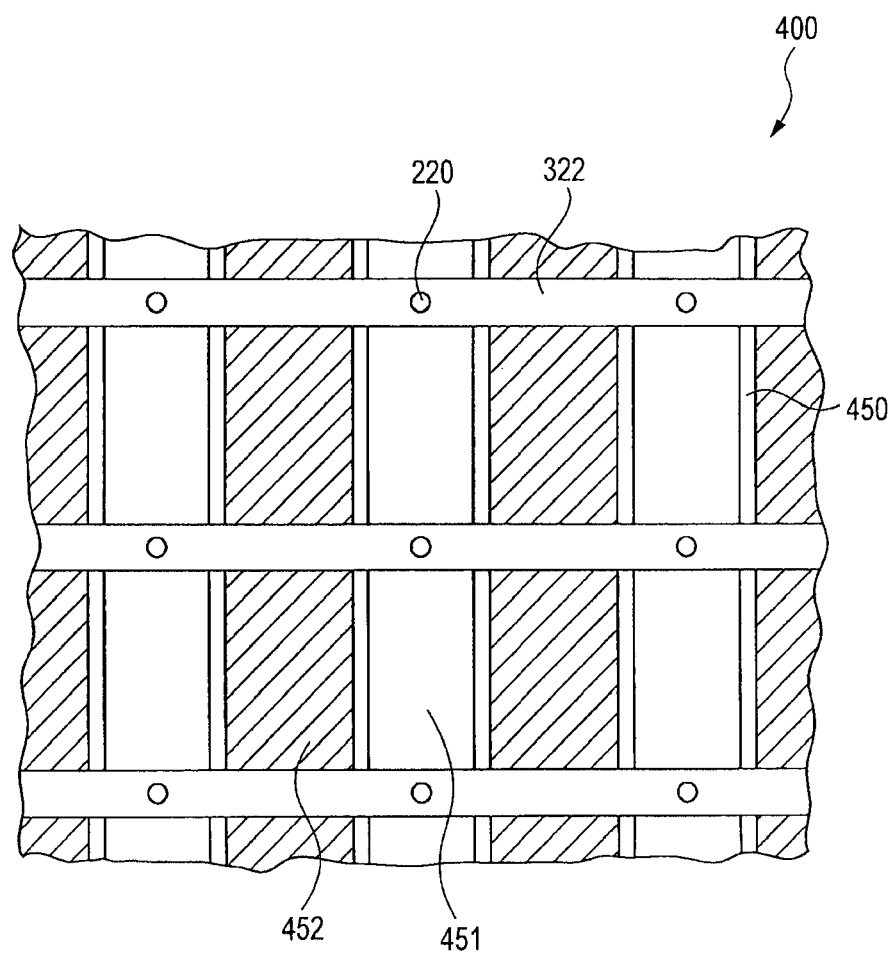

A simplified top view of the array 400 is illustrated in FIG. 3B. From the top view, it is apparent that all access devices and memory cells 220 share a common source metal silicide layer 452 that surrounds the base of each mesa 420. Access devices in the same column share a common gate 450. Additionally, gates 450 may be formed on all sides of each access device, resulting in a surround-gated vertical FET. Memory cells 220 in the same row share a common conductor 322. The common conductor 322 may be made of metal, but may also be made of other conductive materials such as polysilicon, for example. Memory cells 220 are coupled to the upper portion of each mesa 420 via a drain metal silicide 451.

Individual memory cells 220 are activated (meaning that a desired current flows through the memory cell 220) by the appropriate biasing of the source 130, the respective gate 450 and the respective conductor 322. However, because each memory cell 220 in a same column of array 400 shares a same drain 140 and drain metal silicide layer 451 at the top portion of each mesa 420, diode devices 460 are inserted between the bottom electrode 224 of each memory cell 220 and the drain metal silicide 451 at the top portion of each mesa 420. The diode devices 460 function to prevent any sneak current paths in the array 400, thus reducing leakage current. One example of an appropriate diode device 460 is illustrated in FIG. 4.

Figure 4:
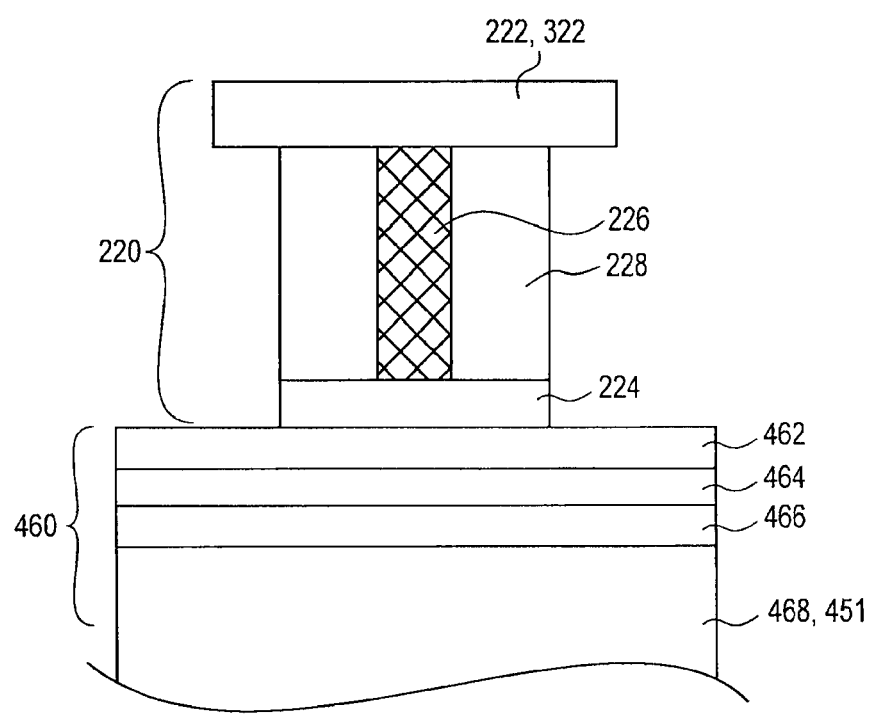
FIG. 4 illustrates a memory cell and a diode device, according to one or more embodiments of the disclosure.

FIG. 4 illustrates a view of a diode device 460 coupled between the bottom portion of a memory cell 220 and the drain metal silicide 451 on the top portion of each mesa 420. In FIG. 4, the memory cell 220 includes a top electrode 222 that is formed by conductor 322. The memory cell 220 also includes a variable resistance material 226 in between the top electrode 222 and the bottom electrode 224. Spacers 228 are also included between the top and bottom electrodes 222, 224 and around the variable resistance material 226. The bottom electrode 224 couples to diode device 460. The diode device 460 is formed, for example, as a MIIM device, or a metal-insulator-insulator-metal device. Other diode configurations are contemplated, e.g., MIM diodes, metal Schottky diodes, and n/p or n+/p+ silicon or geranium diodes, etc. The top of the diode device 460 is a metal 462. The metal 462 directly couples with the bottom electrode 224 of the memory cell 220 and effectively enlarges the size of the bottom electrode 224. The enlargement of bottom electrode 224 facilitates the passage of large current flows during programming of the memory cell 220. Beneath the metal 462 are two insulators 464, 466. Example materials for insulators 464, 466 include $SiO_2$ and $HfO_2$. Beneath the insulators 464, 466 is an additional metal 468. The metal 468 can be the metal silicide 451. The MIIM diode device 460 facilitates extremely fast tunneling of electrons between the two metal layers 462, 468.

Figure 5:
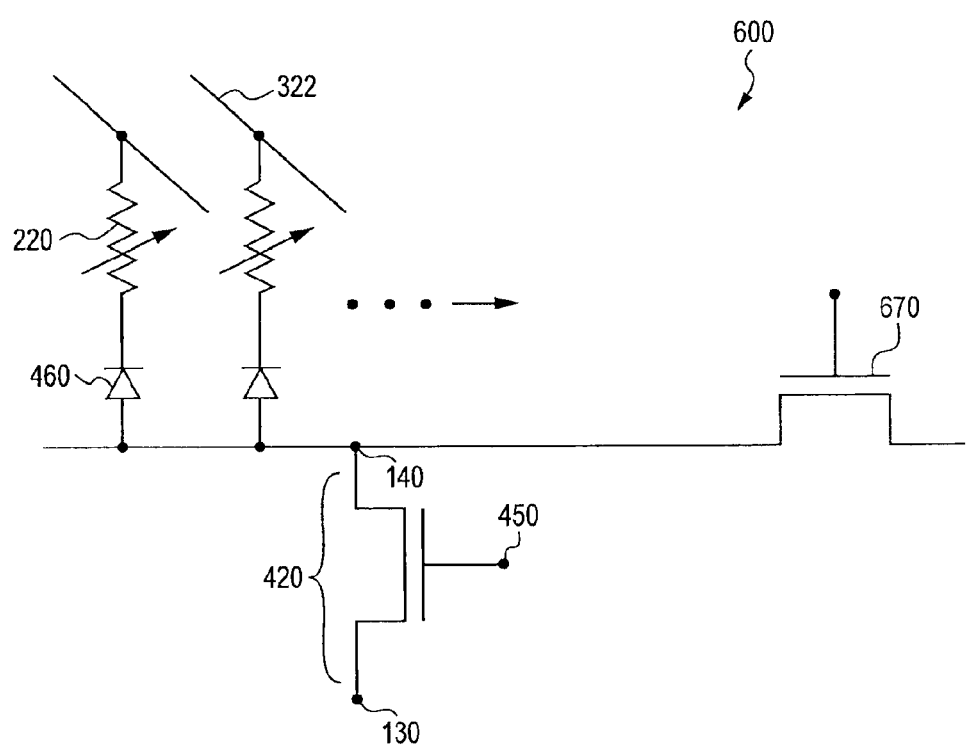
FIG. 5 illustrates a schematic of memory cells with common access device, according to one or more embodiments of the disclosure.

A schematic 600 of a mesa 420 in array 400 is illustrated in FIG. 5. The single mesa 420 in each row constitutes a common access device with common source 130, gate 450 and drain 140. For each memory cell coupled to the common access device, a conductor 322, memory cell 220 and diode device 460 are serially coupled to the common drain 140. Individual memory cells 220 are activated by the appropriate biasing of the source 430, the respective gate 450 and the respective conductor 322. While biasing the source 430 or any one of the gates 450 or conductors 322 may affect multiple memory cells 220, activation of a specific memory cell 220 is only accomplished through the appropriate biasing of that cell's gate 450 and conductor 322.

Schematic 600 also includes an additional transistor control device 670 that is coupled to the common drain 140 of each mesa. While inclusion of the transistor control device 670 is optional, the transistor control device 670 may be used to control the voltage of the common drain 140 of non-activated columns in array 400. By appropriately biasing the common drains 140 of non-activated columns in array 400, the diode devices 460 in these non-activated columns can be maintained in an "off" state so as to block any sneak current leakage paths from an activated column. Biasing the non-activated columns nearest an activated column in an array 400 using the transistor control device 670 is especially useful at blocking current leakage paths.

In the array 400, the source metal silicide 452 near the bases of the mesas 420 are not interconnected. Thus, the memory cells 220 of array 400 only share a common source 130 for each column of the array 400. Therefore, dedicated contacts for source metal silicide 452 are necessary.

Figure 6A:
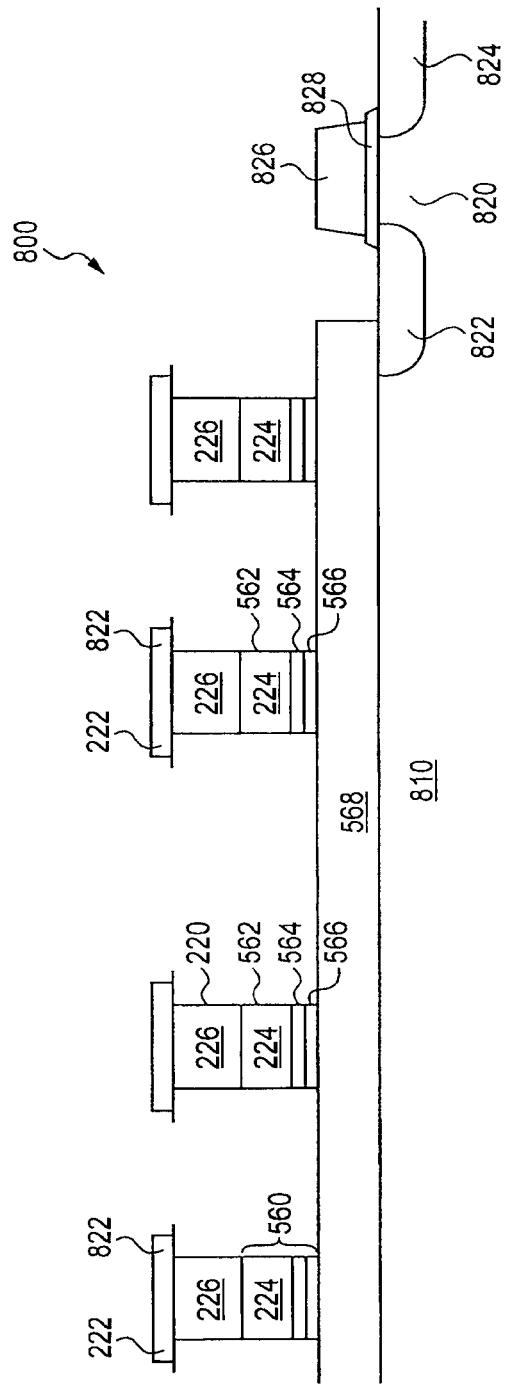
FIGS. 6A and 6B illustrate an array of memory cells and memory access devices, according to one or more embodiments of the disclosure.

The benefits of array 400, which include a more compact arrangement of memory cells 220 due to the sharing of access devices, may also be realized through an additional embodiment utilizing planar access devices. FIG. 6A illustrates a single column of memory cells 220 in an array 800. The array 800 includes a silicon substrate 810 and one or more columns (and rows) of memory cells 220. The memory cells include a top electrode 222 that is formed by conductor 822. The memory cell 220 also includes a variable resistance material 226 between the top electrode 222 and a bottom electrode 224. The bottom electrode 224 couples to diode device 560. The diode device 560 is formed, for example, as a MIIM device, or a metal-insulator-insulator-metal device. Other diode configurations are contemplated, e.g., MIM diodes, etc. The top layer of the diode device 560 is a metal 562. The metal 562 can be the bottom electrode 224 of the memory cell 220. Beneath the metal 562 are two insulators 564, 566. Example materials for the insulators include $SiO_2$ and $HfO_2$. Beneath the insulators 564, 566 is an additional metal 568. The metal 568 is supported by the silicon substrate 810 and is common to multiple memory cells 220 in the same column.

The additional metal 568 is coupled to the drain of a planar access device 820. The access device 820, which includes a doped drain region 822, a doped source region 824, and an gate 826 separated from the doped drain and source regions by a gate oxide layer 828, is used to pass current to any one of the memory cells 220 in the column sharing the same metal 568. As in array 400, the individual memory cells 220 of array 800 are activated through the appropriate biasing of the conductors 822 and the metal 568, wherein biasing of the metal 568 is gated by the access devices 820.

Figure 6B:
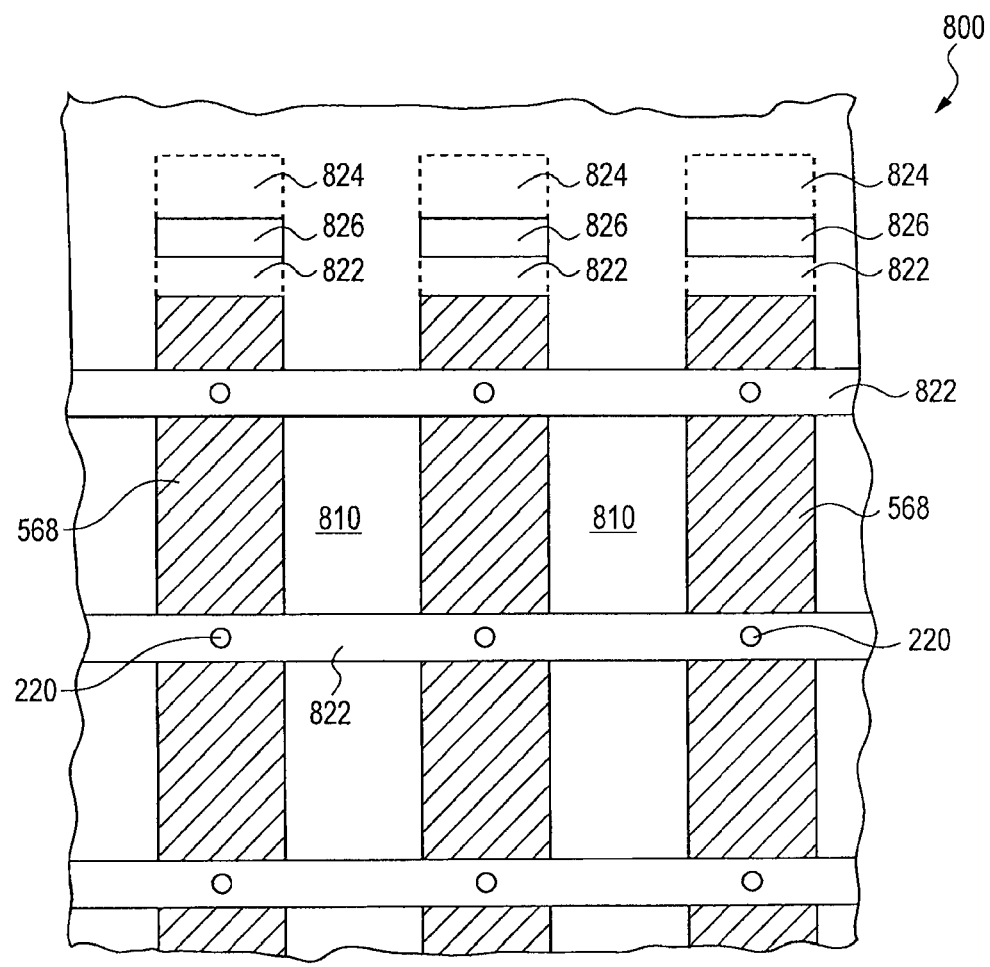

A simplified top view of the array 800 is illustrated in FIG. 6B. From the top view, it is apparent that all memory cells 220 in a column share a common access device 820.

The memory access devices of arrays 400 and 800 are able to provide large amounts of current through any selected memory cell 220. In both arrays 400 and 800, access devices share common sources 130 which facilitate larger source currents. Additionally, in both arrays 400 and 800, the memory cell columns share common gates and drains. This sharing of common access devices allows for a more densely packed array of memory cells 220.

Figure 7:
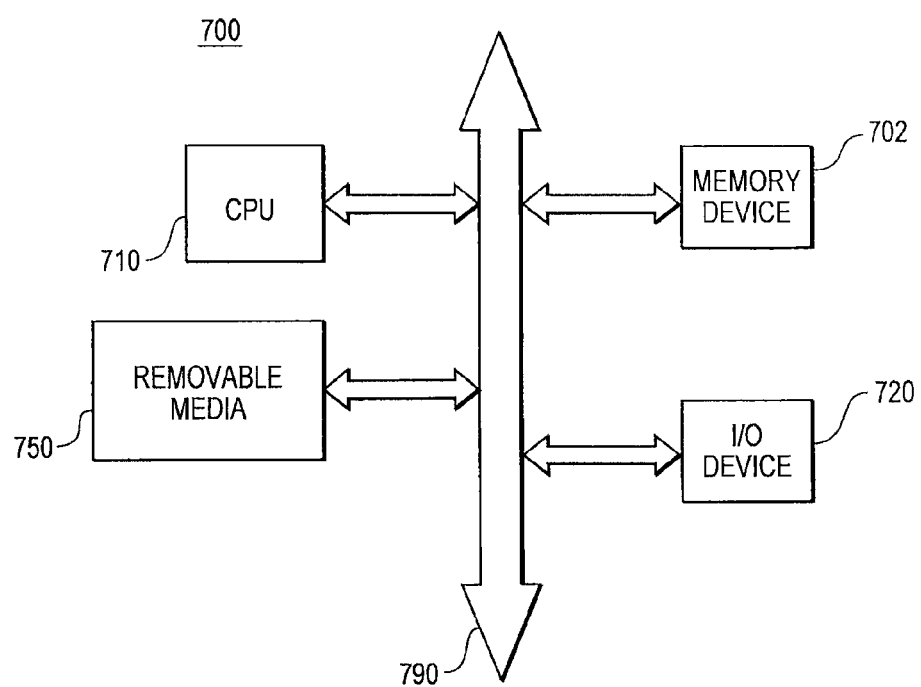
FIG. 7 illustrates a processing system utilizing a memory array, according to one or more embodiments of the disclosure.

It should be appreciated that the arrays 400, 800 may be fabricated as part of an integrated circuit. The corresponding integrated circuits may be utilized in a processor system. For example, FIG. 7 illustrates a simplified processor system 700, which includes a memory device 702 that includes array 400, 800 in accordance with any of the above described embodiments. A processor system, such as a computer system, generally comprises a central processing unit (CPU) 710, such as a microprocessor, a digital signal processor, or other programmable digital logic devices, which communicates with an input/output (I/O) device 720 over a bus 790. The memory device 702 communicates with the CPU 710 over bus 790 typically through a memory controller.

In the case of a computer system, the processor system 700 may include peripheral devices such as removable media devices 750 (e.g., CD-ROM drive or DVD drive) which communicate with CPU 710 over the bus 790. Memory device 702 can be constructed as an integrated circuit, which includes one or more phase change memory devices. If desired, the memory device 702 may be combined with the processor, for example CPU 710, as a single integrated circuit.

The above description and drawings should only be considered illustrative of exemplary embodiments that achieve the features and advantages described herein. Modification and substitutions to specific process conditions and structures can be made. Accordingly, the claimed invention is not to be considered as being limited by the foregoing description and drawings, but is only limited by the scope of the appended claims.

What is claimed as new and desired to be protected by Letters Patent of the United States is:

1. A memory device comprising:
    a plurality of memory cells, each having a first and second electrical contact;
    a plurality of diode devices, each electrically coupled to a second electrical contact of a respective memory cell;
    a plurality of selectable conductive lines, each electrically coupled to a first electrical contact of a respective memory cell;
    an access device, commonly coupled to the plurality of diode devices through a node, for accessing one of the plurality of memory cells through a corresponding diode device and a selected one of the conductive lines; and
    a transistor control device separate from the access device and having one terminal connected to the node and a control gate, the control gate when activated, causing the transistor control device to provide a bias to the node to maintain diode devices connected to non-selected conductive lines in an off-state.

2. A memory device as in claim 1, wherein said diode devices are MIIM devices, comprising a first metal positioned above a first insulator positioned above a second insulator positioned above said conductor.

3. A memory device as in claim 2, wherein each of said first and second insulators are comprised of one of $SiO_2$ and $HfO_2$.

4. A memory device as in claim 1, wherein the memory cells comprise variable resistance memory cells.

5. A memory device as in claim 1, wherein the access device is a vertical transistor and the node comprises a common drain connected to the plurality of diode devices.

6. A memory device comprising:
    a plurality of memory cells, each having a first and second electrical contact;
    a plurality of diode devices, each electrically coupled to a second electrical contact of a respective memory cell;
    a plurality of selectable conductive lines, each electrically coupled to a first electrical contact of a respective memory cell;

an access device, commonly coupled to the plurality of diode devices through a node, for accessing one of the plurality of memory cells through a corresponding diode device and a selected one of the conductive lines;

a control device having one terminal connected to the node and a control terminal, the control terminal when activated, causing the control device to provide a bias to the node which maintains diode devices connected to non-selected conductive lines in an off-state; and wherein the one terminal of the control device is directly connected to the node.

\* \* \* \* \*